(12) United States Patent
Ohta

(10) Patent No.: US 7,851,788 B2
(45) Date of Patent: Dec. 14, 2010

(54) ORGANIC TRANSISTOR AND MANUFACTURING METHOD THEREOF

(75) Inventor: Satoru Ohta, Saitama (JP)

(73) Assignee: Pioneer Corporation, Tokyo (JP)

( * ) Notice: Subject to any disclaimer, the term of this patent is extended or adjusted under 35 U.S.C. 154(b) by 150 days.

(21) Appl. No.: 12/224,492

(22) PCT Filed: Dec. 27, 2006

(86) PCT No.: PCT/JP2006/326094

§ 371 (c)(1),
(2), (4) Date: Feb. 26, 2009

(87) PCT Pub. No.: WO2007/099690

PCT Pub. Date: Sep. 7, 2007

(65) Prior Publication Data

US 2009/0166611 A1    Jul. 2, 2009

(30) Foreign Application Priority Data

Feb. 28, 2006   (JP) .............................. 2006-051664

(51) Int. Cl.
*H01L 35/24* (2006.01)
*H01L 51/00* (2006.01)
*H01L 21/00* (2006.01)

(52) U.S. Cl. .......... 257/40; 257/E51.005; 257/E21.625; 257/E21.639; 438/99; 438/158; 438/287

(58) Field of Classification Search .................. 257/40, 257/288, E51.002, E51.003, E51.005, E21.625, 257/E21.639; 438/99, 158, 287

See application file for complete search history.

(56) References Cited

U.S. PATENT DOCUMENTS

| | | | | |
|---|---|---|---|---|
| 6,344,660 | B1 * | 2/2002 | Dimitrakopoulos et al. | ... 257/40 |
| 6,380,011 | B1 * | 4/2002 | Yamazaki et al. | ........... 438/163 |
| 7,005,674 | B2 * | 2/2006 | Lee et al. | ....................... 257/40 |
| 7,151,276 | B2 * | 12/2006 | Gerlach et al. | ................ 257/40 |
| 7,364,940 | B2 * | 4/2008 | Kim et al. | ..................... 438/99 |

(Continued)

FOREIGN PATENT DOCUMENTS

CN          1582505         2/2005

(Continued)

OTHER PUBLICATIONS

International Search Report mailed Mar. 27, 2007 in the International (PCT) Application of which the present application is the U.S. National Stage.

(Continued)

*Primary Examiner*—Lex Malsawma
(74) *Attorney, Agent, or Firm*—Wenderoth, Lind & Ponack, L.L.P.

(57) ABSTRACT

To provide an organic transistor which can achieve a reduced leak current from a gate electrode. An organic transistor including a substrate 1, a pair of a source electrode 4 and a drain electrode 5, an organic semiconductor layer 6 provided between the source electrode 4 and the drain electrode 5, and a gate electrode 2 provided in association with the organic semiconductor 6 with a gate insulating layer 3 interposed therebetween, wherein the gate insulating layer 3 has a stacked structure including at least an organic insulating layer 3*a* and an inorganic barrier layer 3*b*.

13 Claims, 4 Drawing Sheets

U.S. PATENT DOCUMENTS

| | | | |
|---|---|---|---|
| 7,692,184 B2 * | 4/2010 | Koinuma et al. | 257/40 |
| 2003/0102471 A1 | 6/2003 | Kelley et al. | |
| 2003/0102472 A1 | 6/2003 | Kelley et al. | |
| 2004/0222412 A1 * | 11/2004 | Bai et al. | 257/40 |
| 2005/0189536 A1 * | 9/2005 | Zschieschang et al. | 257/40 |
| 2005/0263765 A1 | 12/2005 | Maekawa | |
| 2005/0285102 A1 | 12/2005 | Koo et al. | |
| 2006/0027805 A1 | 2/2006 | Koo et al. | |
| 2006/0151781 A1 * | 7/2006 | Kim et al. | 257/40 |
| 2006/0157692 A1 * | 7/2006 | Wada et al. | 257/40 |
| 2006/0202191 A1 * | 9/2006 | Gerlach et al. | 257/40 |
| 2006/0214154 A1 * | 9/2006 | Yang et al. | 257/40 |
| 2007/0051947 A1 * | 3/2007 | Nakayama et al. | 257/40 |

FOREIGN PATENT DOCUMENTS

| | | |
|---|---|---|
| CN | 1713409 | 12/2005 |
| CN | 1738070 | 2/2006 |
| JP | 2005-093700 | 4/2005 |
| JP | 2005-509298 | 4/2005 |
| JP | 2005-509299 | 4/2005 |
| JP | 2006-013468 | 1/2006 |
| JP | 2006-013480 | 1/2006 |
| JP | 2006-049836 | 2/2006 |
| KR | 10-2005-0039730 | 4/2005 |
| KR | 10-2005-0039731 | 4/2005 |
| KR | 10-2005-0123332 | 12/2005 |
| KR | 10-2006-0013598 | 2/2006 |
| WO | 03/041185 | 5/2003 |
| WO | 03/041186 | 5/2003 |
| WO | 2006/019157 | 2/2006 |

OTHER PUBLICATIONS

International Preliminary Report on Patentability (English language) mailed on Oct. 9, 2008.

* cited by examiner

ORGANIC TRANSISTOR AND MANUFACTURING METHOD THEREOF

This is a National Stage of International Application No. PCT/JP2006/326094, filed Dec. 27, 2006, which claims the benefit of Japanese Application No. 2006-051664, filed Feb. 28, 2006, the contents of which are incorporated herein in their entirety.

TECHNICAL FIELD

The present invention relates to an organic transistor and a manufacturing method thereof.

BACKGROUND ART

Organic transistors can be formed by using a flexible organic material capable of being applied as a coating and are expected to be used for driving elements of displays and IC tags. An organic transistor having a MOS-FET (metal oxide semiconductor field-effect transistor) structure includes a gate electrode, a gate insulating layer, a source electrode, a drain electrode, and an organic semiconductor layer which are formed over a substrate. A voltage is applied between the source electrode and the drain electrode from the gate electrode through the gate insulating layer to control an electric current passing through the organic semiconductor layer.

Organic TFTs (thin film transistors) have been studied actively in recent years, and it is expected that the organic TFTs will be applied, for example, to flexible displays by virtue of the flexibility of an organic semiconductor itself and the use of a resin substrate. In the organic TFTs, semiconductor layers are typically formed by vapor deposition. Pentacene, one of materials studied most actively, exhibits a mobility of 1 $cm^2/Vs$ or higher which is equal to or higher than that of amorphous silicon, and is expected to be used more widely in an organic semiconductor element.

To make the best possible use of the organic TFTs, various attempts have been made to form organic TFTs by coating application including the use of printing techniques with the aim of a low-cost process. Specifically, attempts have been made to form a film of polyalkylthiophene which is a polymeric semiconductor or a low-molecular-weight material such as a pentacene precursor by coating application. In addition to the semiconductor layer, the gate insulating layer has been studied to develop a material thereof soluble in a solvent such as a polymer which can be formed into a film by coating application.

Japanese Patent Laid-Open No. 2002-110999 has proposed a gate insulating film formed of a polymeric material having a high dielectric constant by including fine particles of metal oxide having a high dielectric constant dispersed in an amorphous insulator formed of a polymeric material having a high dielectric constant and containing a cyano group such as cyanoehylpullulan. The polymeric material having a high dielectric constant, however, generally has a low volume resistivity and is significantly polarized to have localized carriers, which tends to reduce the performance of the resulting transistor and have a poor surface property.

On the other hand, each of Japanese Patent Laid-Open Nos. 2005-72569 and 2005-26698 has proposed a high-performance organic transistor by using a gate insulating layer of stacked structure in which an insulating layer having a high dielectric constant is used for a first layer closer to a gate electrode and a flat polymeric material having a low dielectric constant is used for a second layer.

DISCLOSURE OF THE INVENTION

Problems to be Solved by the Invention

When the gate insulating layer includes a polymeric material, however, an ion component contained in an alkaline developer or acid etchant used in an etching or lift-off step may enter the gate insulating layer during formation of a source electrode and a drain electrode. In addition, during formation of the organic semiconductor layer by coating application, an ion component contained in a solvent for solving the organic semiconductor, an ion component contained in the organic semiconductor when the organic semiconductor material can be applied as a coating, or the low-molecular-weight organic semiconductor itself when the organic semiconductor material can be applied as a coating may penetrate the gate insulating layer including a polymeric material.

The ion component or the organic semiconductor material entering the gate insulating layer in this manner may cause a leak current from the gate electrode in the finished transistor to increase an electric current at turn-off, which leads to a reduction in on/off ratio.

Countermeasures against the problem of the leak current from the gate electrode include a gate insulating layer formed of an inorganic material such as $SiO_2$ by sputtering or the like. However, if the gate insulating material is formed only of an inorganic material, the resulting flexible substrate suffers from a poor bending strength and cracks are produced when it is bent, for example.

Problems to be solved by the present invention include the abovementioned one, by way of example.

It is thus an object of the present invention to provide an organic transistor which can be used for a flexible substrate and can achieve a reduced leak current from a gate electrode.

Means for Solving Problems

As described in claim 1, the present invention provides an organic transistor including a substrate, a pair of a source electrode and a drain electrode, an organic semiconductor layer provided between the source electrode and the drain electrode, and a gate electrode provided in association with the organic semiconductor layer with a gate insulating layer interposed therebetween, wherein the gate insulating layer has a stacked structure including, in order from the side thereof closer to the gate electrode, an organic insulating layer in a first layer, an inorganic barrier layer, and an organic insulating layer in a second layer made of a material of a different type from the organic insulating layer in the first layer.

As described in claim 10, the present invention provides a method of manufacturing an organic transistor including a substrate, a pair of a source electrode and a drain electrode, an organic semiconductor layer provided between the source electrode and the drain electrode, and a gate electrode provided in association with the organic semiconductor layer with a gate insulating layer interposed therebetween, wherein a step of forming the gate insulating layer includes forming a stacked structure by stacking, in order, an organic insulating layer in a first layer, an inorganic barrier layer, and an organic insulating layer in a second layer made of a different material from the organic insulating layer in the first layer.

BEST MODE FOR CARRYING OUT THE INVENTION

Figure 1:
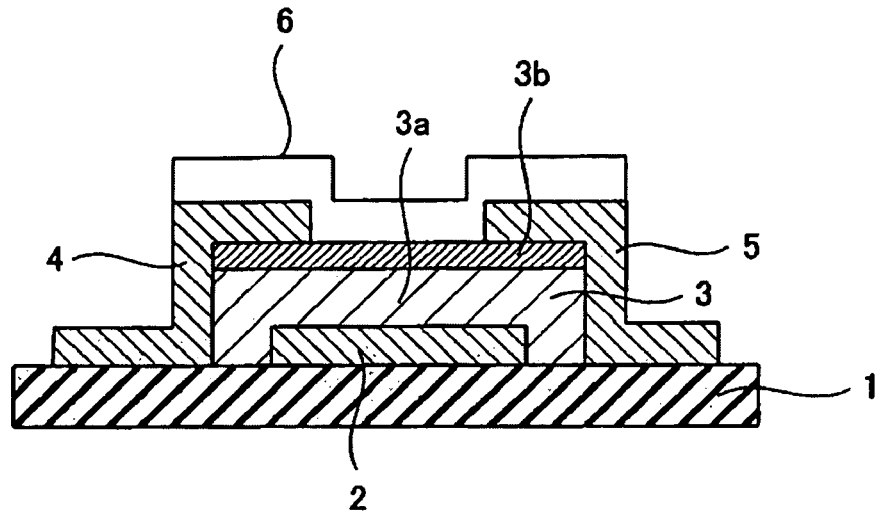
FIG. 1 A schematic diagram showing a section view of an exemplary organic transistor according to an embodiment of the present invention.

An embodiment according to the present invention will hereinafter be described with reference to FIGS. 1 to 7. The present invention is not limited by the illustration in the following description.

An organic transistor according to the present invention includes a substrate, a pair of a source electrode and a drain electrode, an organic semiconductor layer provided between the source electrode and the drain electrode, and a gate electrode provided in association with the organic semiconductor layer with a gate insulating layer interposed therebetween. When a voltage is applied to the organic semiconductor layer from the gate electrode via the gate insulating layer during application of a voltage between the source electrode and the drain electrode, an electric current passes through the organic semiconductor layer from the source electrode to the drain electrode.

The present invention is characterized in that the gate insulating layer has a stacked structure including at least an organic insulating layer and an inorganic barrier layer. With the structure, since the inorganic barrier layer is placed on the path of a leak current from the gate electrode, the leak current can be prevented from being diffused.

The gate insulating layer in the organic transistor desirably includes an organic insulating layer containing an organic material as a flexible material capable of being applied as a coating. If the gate insulating layer is formed only of the organic insulating layer, however, the organic insulating layer may be penetrated by the ion component involved in the formation of the source electrode and the drain electrode, the ion component contained in the solvent associated with the formation of the organic semiconductor layer, and the organic semiconductor itself. The ion component or the organic semiconductor may cause diffusion of a leak current from the gate electrode to increase the electric current value at turn-off of the transistor. To address this, the gate insulating layer is formed to have the stacked structure including the organic insulating layer and the inorganic barrier layer as in the present invention. The organic insulating layer maintains the insulation and the flexibility of the gate insulating layer while the inorganic barrier layer in the gate insulating layer serves as a barrier to prevent the diffusion of the leak current from the gate electrode, thereby allowing a reduced leak current from the gate electrode.

The inorganic barrier layer has a better barrier function against the leak current as compared with the organic material and favorably maintains the excellent barrier function since the ion component or the component of the organic semiconductor material does not easily enter the inorganic barrier layer, so that the diffusion of the leak current can be prevented effectively. In addition, since the inorganic barrier layer can be formed by coating application as described later, the manufacturing steps can be simplified.

As shown in FIG. 1, an exemplary organic transistor is provided in which a gate electrode 2 is formed on a substrate 1, a gate insulating layer 3 is formed on the gate electrode 2, a source electrode 4 and a drain electrode 5 in a pair are formed to space on the gate insulating layer 3, and an organic semiconductor layer 6 is formed thereon in contact with the gate insulating layer 3 between the source electrode 4 and, the drain electrode 5.

The gate insulating layer 3 shown in FIG. 1 includes an organic insulating layer 3a and an inorganic barrier layer 3b stacked in order from the side closer to the gate electrode 2. In this structure, the organic insulating layer 3a can maintain the insulation while the inorganic barrier layer 3b can prevent the diffusion of the leak current from the gate electrode 2. The gate insulating layer 3 has a high bending strength as a whole since the inorganic barrier layer 3b is relatively thin and advantage is taken of the flexibility of the organic insulating layer. Both the organic insulating layer 3a and the inorganic barrier layer 3b can be formed by using a coating application process to simplify the manufacturing steps to reduce the cost.

Figure 2:
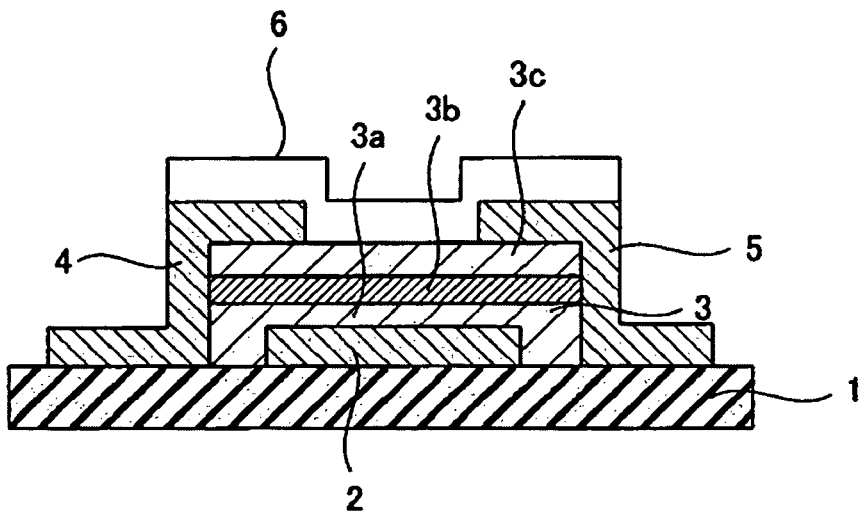
FIG. 2 A schematic diagram showing a section view of another exemplary organic transistor according to the embodiment of the present invention.

As shown in FIG. 2, another exemplary gate insulating layer according to the present invention includes an organic insulating layer 3a in a first layer, an inorganic barrier layer 3b, and an organic insulating layer 3c in a second layer stacked in order from the side closer to a gate electrode 2. Such a structure including the inorganic barrier layer 3b between the organic insulating layers 3a and 3c in the two layers can also prevent diffusion of a leak current from the gate electrode 2. The organic insulating layers 3a and 3c in the two layers can be formed by using the same organic material or by using different organic materials. For example, the organic insulating layer 3a in the first layer closer to the gate electrode can be formed by using an organic material having a relatively high dielectric constant and the organic insulating layer 3c in the second layer closer to the organic semiconductor layer can be formed by using a material having a function of light distribution in liquid crystal, thereby realizing the functions of the respective layers.

Figure 3:
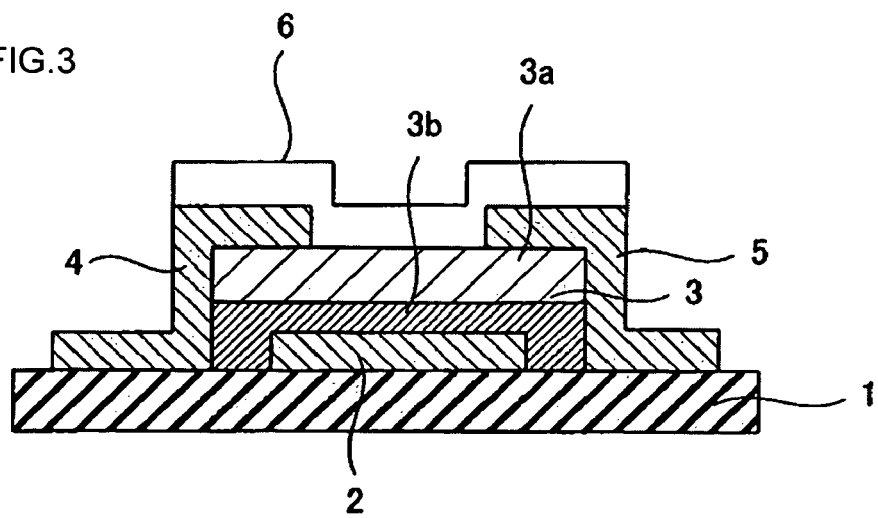
FIG. 3 A schematic diagram showing a section view of another exemplary organic transistor according to the embodiment of the present invention.

As shown in FIG. 3, another exemplary gate insulating layer according to the present invention includes an inorganic barrier layer 3b and an organic insulating layer 3a stacked in order from the side closer to a gate electrode 2. The inorganic barrier layer 3b provided closer to the gate electrode 2 can also prevent diffusion of a leak current from the gate electrode 2. The inorganic barrier layer 3b is formed of a high-dielectric-constant material and the organic insulating layer 3a is formed of a low-dielectric-constant material to enable a high-performance transistor structure.

Figure 4:
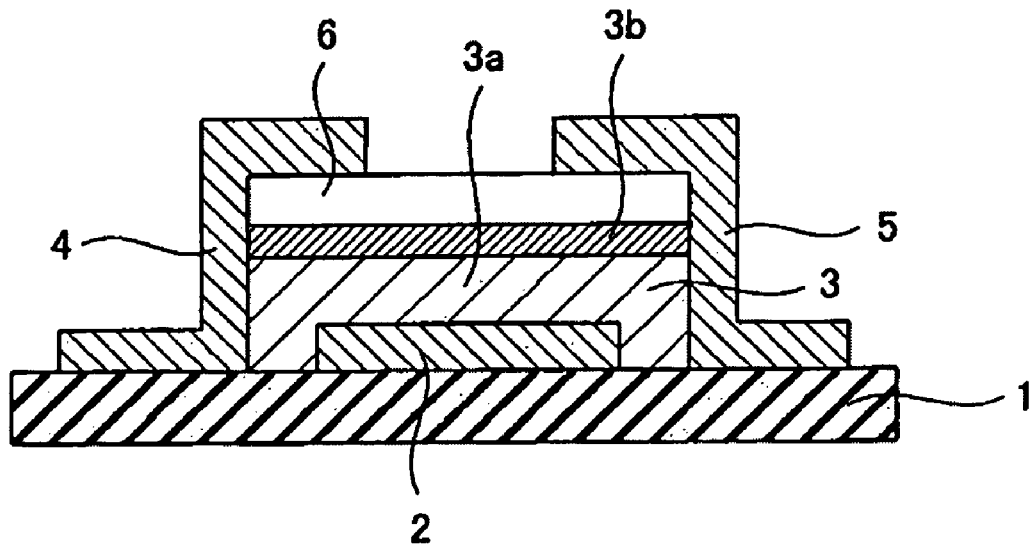
FIG. 4 A schematic diagram showing a section view of an exemplary top-contact type organic transistor according to the embodiment of the present invention.

As shown in FIG. 4, in an example of a top-contact type organic transistor, a gate electrode 2, an organic insulating layer 3a, an inorganic barrier layer 3b, and an organic semiconductor layer 6 are formed in order over a substrate 1, and a source electrode 4 and a drain electrode 5 are formed to space on the organic semiconductor layer 6. In such a structure, the inorganic barrier layer can also prevent a leak current from the gate electrode.

The gate insulating layer according to the present invention is not limited to the abovementioned forms. The number of stacked organic insulating layers and inorganic barrier layers, the order of the stack, and the type can be modified as appropriate.

The inorganic barrier layer of the gate insulating layer contains mainly an inorganic material and performs a barrier function against a leak current. The inorganic barrier layer is preferably formed by a coating application process or a vacuum process.

The inorganic barrier layer can be formed by applying a coating of inorganic polymeric material onto the underlying layer such as the gate electrode, the organic insulating layer, or the organic semiconductor layer, and changing the inorganic polymeric material into an appropriate inorganic material by heating, UV treatment, or a combination of UV treatment and ozone treatment. Examples of such an inorganic polymeric material include polymetalloxane containing an M—O—Si (where M represents a metal) bond or polysilazane containing a Si—N bond. An example of polymetalloxane is polysiloxane containing a Si—O—Si bond where M is Si or polytitano-metalloxane containing Ti. These materials can be subjected to heating to provide an inorganic material mainly containing silicon oxide and/or titanium oxide. According to the coating application process, the dielectric constant of the provided inorganic barrier layer ranges from 2.0 to 48 which is a typical dielectric constant of $TiO_2$. The inorganic polymeric material may be formed into the inorganic material by performing UV treatment or a combination of UV treatment and ozone treatment.

The heating of the inorganic polymeric material is preferably performed at 400° C. or lower, more preferably at 200° C. or lower. At a temperature higher than that, if an organic material for an organic insulating layer or an organic conductive layer is provided before the formation of the inorganic barrier layer or if a resin substrate is used for the substrate, the organic material may be altered by the heat.

The coating application of the inorganic polymeric material is performed by spin coating or dip coating, for example. If necessary, the inorganic polymeric material is solved in a solvent such as 1-butanol and then applied.

Since the inorganic barrier layer thus formed performs the barrier function against a leak current, diffusion of the leak current from the gate electrode can be prevented to provide a high-performance organic transistor. The inorganic barrier layer can be formed by the coating application, so that the resulting film can be provided homogeneously at low cost. The inorganic barrier layer can be formed by the heating at low temperature or the UV treatment or the combination of UV treatment and ozone treatment instead of the heating, thereby preventing thermal damage to the underlying organic material.

The inorganic barrier layer can be provided by a vacuum process such as a vacuum deposition method, a vacuum sputtering method, or a CVD method. Such a vacuum process can be used to form an inorganic film containing a metal oxide such as silicon oxide or a metal nitride such as silicon nitride. The vacuum process allows formation of the homogeneous inorganic film having a dense structure.

The inorganic barrier layer has an average surface roughness of 0.1 nm to 50 nm, preferably 1.5 nm or lower. A barrier layer having a roughness lower than the range is difficult to form homogeneously, while a barrier layer having a roughness higher than the range may affect the material of the layer in contact with the inorganic barrier layer to reduce the transistor performance.

The inorganic barrier layer has a thickness of 5 nm to 700 nm, preferably 500 nm or lower. A barrier layer having a thickness lower than the range is difficult to provide homogeneously in view of a molecular thickness of approximately 5 nm, while a barrier layer having a thickness higher than the range makes up a considerable proportion to the organic insulating layer to prevent the advantageous use of the characteristics of the organic insulating layer in the light of the fact that the gate insulating layer is allowed to have a thickness of approximately 1 μm.

The organic insulating layer of the gate insulating layer contains an insulating organic material, preferably a flexible material capable of being applied as a coating. When the source electrode, the drain electrode, and the organic semiconductor layer are formed after the formation of the organic insulating layer as in the example shown in FIG. 1, it is desirable to form the organic insulating layer by using an organic material having resistance to an ion component involved in the formation of the source electrode and the drain electrode, to a solvent used in forming the organic semiconductor layer, and to the organic semiconductor itself. In addition, it is desirable to use a material resistant to thermal treatment in the manufacturing steps.

An example of the organic insulating layer is a cured mixture of PVP (polyvinyl phenol) and a melamine derivative. Such a polymeric material does not necessarily need to be cured as long as it has resistance to solvent and heat. Other examples thereof include polyimide, polysilsesquioxane, and bis-benzocyclobutene.

The organic insulating layer can be formed by the coating application. For example, a polymeric material such as a mixture of PVP and a melamine derivative is solved in a solvent, applied onto the underlying layer, dried as appropriate, and cured as appropriate.

The organic insulating layer preferably has a thickness of 50 nm to 1 μm. An extremely small thickness may cause a gate leak during operation, while an extremely large thickness may reduce the field effect to require a high voltage during operation.

The organic insulating layer thus formed has a dielectric constant of 2.0 to 18.

Next, a method of forming the gate insulating layer will be described specifically. The organic transistor shown in FIG. 1 is provided by forming the gate electrode 2 on the substrate 1, applying the insulating organic material onto the gate electrode 2, drying and curing it as appropriate to form the organic insulating layer 3a, then applying the inorganic polymeric material onto the organic insulating layer 3a, and changing the inorganic polymeric material into the inorganic material by heating at a temperature lower than the decomposition temperature of the underlying organic insulating layer 3a to form the inorganic barrier layer 3b. In such a method, the inorganic barrier layer 3b can be treated at a temperature lower than the decomposition temperature of the organic insulating layer 3a, so that the inorganic barrier layer 3b can be formed while the organic insulating layer 3a is protected. Since the inorganic barrier layer 3b is provided as the upper layer of the gate insulating layer 3, the inorganic barrier layer 3b can protect the organic insulating layer 3a during the formation of the source electrode 4, the drain electrode 5, and the organic semiconductor layer 6 thereon.

The organic transistor shown in FIG. 2 is provided by forming the organic insulating layer 3a in the first layer and the inorganic barrier layer 3b according to the abovementioned method, and forming the organic insulating layer 3a in the second layer on the inorganic barrier layer 3b in the same manner as in the first layer. In such a method, the inorganic barrier layer 3b can be treated at a temperature lower than the decomposition temperature of the organic insulating layer 3a, so that the inorganic barrier layer 3b can be formed while the organic insulating layer 3a in the first layer is protected. The two or more organic insulating layers are stacked with the inorganic barrier layer 3b interposed therebetween, which can prevent diffusion of composition between the organic insulating layers when the organic insulating layer 3c in the second layer is formed.

The organic transistor shown in FIG. 3 is provided by forming the gate electrode 2 on the substrate 1, applying the inorganic polymeric material onto the gate electrode 2, changing the inorganic polymeric material into the inorganic material by heating to form the inorganic barrier layer 3b, then applying the insulating organic material onto the inorganic barrier layer 3b, and drying and curing it as appropriate to form the organic insulating layer 3a. In such a method, since the gate electrode 2 is provided under the inorganic barrier layer 3b, the treatment temperature of the inorganic barrier layer 3b can be set to a high level. When a resin substrate is used, the inorganic barrier layer 3b is treated at a temperature lower than the decomposition temperature of the resin forming the resin substrate.

The substrate is not limited particularly and a glass substrate can be used, for example. As long as the inorganic barrier layer can be processed at a temperature of 400° C. or lower, it is possible to use a plastic substrate such as PES (polyethersulphone) or PC (polycarbonate), a bonded substrate including glass and plastic, or a substrate coated with an alkaline barrier film or a gas barrier film.

The organic semiconductor layer may be formed of an organic material exhibiting semiconductor characteristics. Pentacene can be used, and low-molecular-weight materials can be used such as a phthalocyanine-based derivative, a naphthalocyanine-based derivative, an azo compound-based derivative, a perylene-based derivative, an indigo-based derivative, a quinacridone-based derivative, a polycyclic quinone-based derivative such as anthraquinone, a cyanine-based derivative, a fullerene derivative, or a nitride-containing cyclic compound derivative such as indole, carbazole, oxazole, inoxazole, thiazole, imidazole, pyrazole, oxaadiazole, pyrazoline, or triazole, a hydrazine derivative, a tripheny-lamine derivative, a triphenylmethane derivative, a quinone compound derivative such as stilbene or anthraquinone diphenoquinone, a porphyrin derivative, and a polycyclic aromatic compound derivative such as anthracene, pyrene, phenanthrene, and coronene. Polymeric materials can be used such as an aromatic-based conjugate polymer such as poly-paraphenylene, an aliphatic-based conjugate polymer such as polyacetylene, a heterocyclic conjugate polymer such as polypinol or polythiophene, a hetero atom-containing conjugate polymer such as polyaniline or polyphenylene sulfide, a carbon-based conjugate polymer including a composite conjugate polymer having alternately bonded unit structures of conjugate polymer such as poly(phenylenevinylene), poly(anilenevinylene), or poly(thionylene vinylene). It is also possible to use a polymer including polysilane or origosilane such as a disilanylene carbon-based conjugate polymer structure including a disilanylene arylene polymer, (disilanylene) ethenylene polymer, or (disilanylene) ethynylene polymer alternately linked with a carbon-based conjugate structure. Other examples include a polymer chain formed of an inorganic element such as phosphorus or nitrogen and a polymer including an aromatic-based ligand of polymer chain such as phthalocyanate polysiloxane, a polymer including thermally treated and fused perylene such as perylene tetracarboxylic acid, a ladder polymer provided by thermally treating a polyethylene derivative including a cyano group such as polyacrylonitrile, and a composite material including an intercalated organic compound in perovskite.

The materials of the source electrode, the drain electrode, and the gate electrode are not limited particularly as long as sufficient conductivity is provided. Examples thereof include metal such as Cr, Pt, Au, W, Ru, Ir, Al, Sc, Ti, V, Mn, Fe, Co, Ni, Zn, Ga, Y, Zr, Nb, Mo, Tc, Rh, Pd, Ag, Cd, Ln, Sn, Ta, Re, Os, Ti, Pb, La, Ce, Pr, Nd, Pm, Sm, Eu, Gd, Tb, Dy, Ho, Er, Tm, Yb, or Lu, or a stack thereof, or a compound thereof. It is also possible to use a metal oxide such as ITO (Indium Tin Oxide) or IZO (Indium Zinc Oxide) and an organic conductive material including a conjugate polymeric compound such as polyaniline, polythiophene, and polypyrrole.

As described above, according to the present invention, in the organic transistor including the substrate, the pair of the source electrode and the drain electrode, the organic semiconductor layer provided between the source electrode and the drain electrode, and the gate electrode provided in association with the organic semiconductor layer with the gate insulating layer interposed therebetween, the gate insulating layer has the stacked structure including the organic insulating layer and the inorganic barrier layer, so that the barrier layer can reduce a leak current from the gate electrode.

In the method of manufacturing the organic transistor including the substrate, the pair of the source electrode and the drain electrode, the organic semiconductor layer provided between the source electrode and the drain electrode, and the gate electrode provided in association with the organic semiconductor layer with the gate insulating layer interposed therebetween, the step of forming the gate insulating layer includes forming the stacked structure including the organic insulating layer and inorganic barrier layer, so that the leak current from the gate electrode can be reduced.

Examples of the present invention will hereinafter be described. The present invention is not limited by the examples.

Example 1

Figure 5:
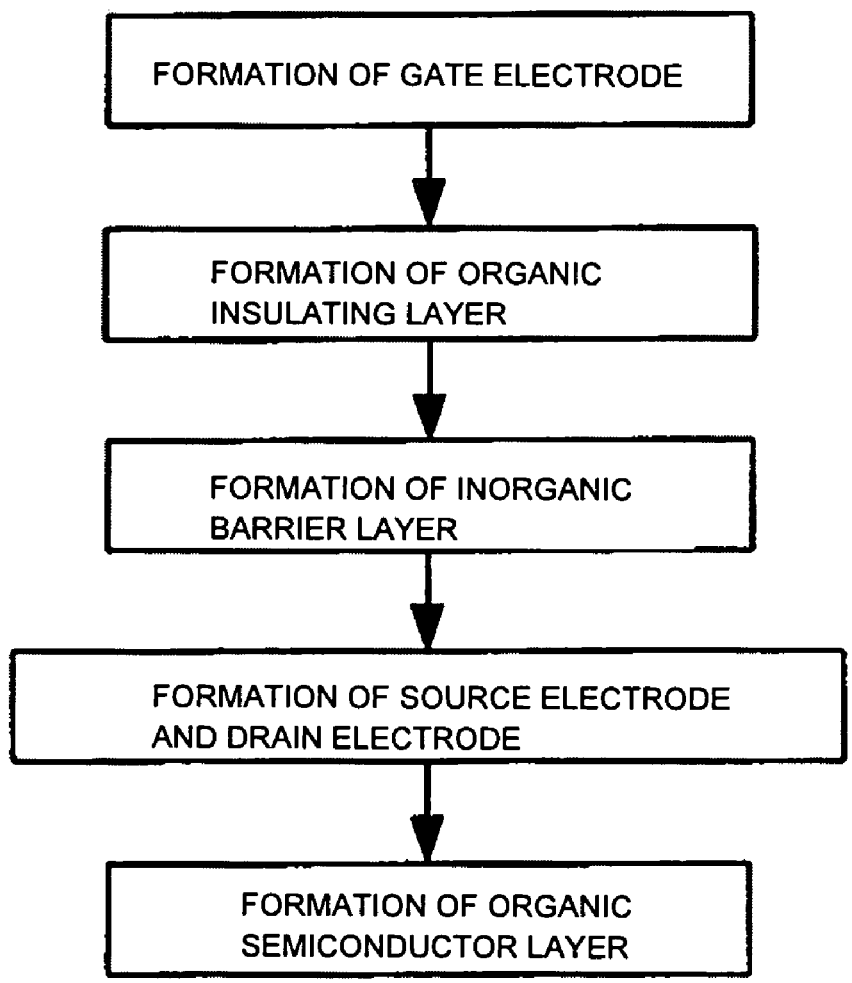
FIG. 5 A flow chart showing a method of manufacturing an organic transistor in Example 1 of the present invention.

In Example 1, the organic transistor shown in FIG. 1 was formed. FIG. 5 shows a flow chart illustrating the method of manufacturing the organic transistor in Example 1.

Cr was deposited as the gate electrode 2 on the glass substrate 1 and was patterned by etching.

A solution provided by mixing 8 wt % polyvinyl phenol (Mw=20000) and 4 wt % polymelamine methylate formaldehyde copolymer (Mn=511) in PEGMEA (propylene glycol monomethylether acetate) was applied onto the gate electrode 2 by spin coating at 2000 rpm and cured by drying at 100° C. for two minutes and heating at 200° C. for five minutes to form the organic insulating layer 3a. The thickness of the organic insulating layer was 270 nm in SEM observation (this applies to the following).

Next, a solution of 10 wt % polytitano-metalloxane solved in 1-butanol was applied onto the organic insulating layer 3a by spin coating at 1000 rpm and was formed into an inorganic film by drying at 100° C. for two minutes and heating at 200° C. for five minutes to provide the barrier layer 3b. The thickness of the barrier layer was 100 nm.

Then, the source electrode 4 and the drain electrode 5 were formed on the barrier layer 3b by patterning Au through photolithography with vacuum deposition. Pentacene was deposited thereon by vacuum deposition to form the organic semiconductor layer 6 to provide the organic transistor.

Example 2

Figure 6:
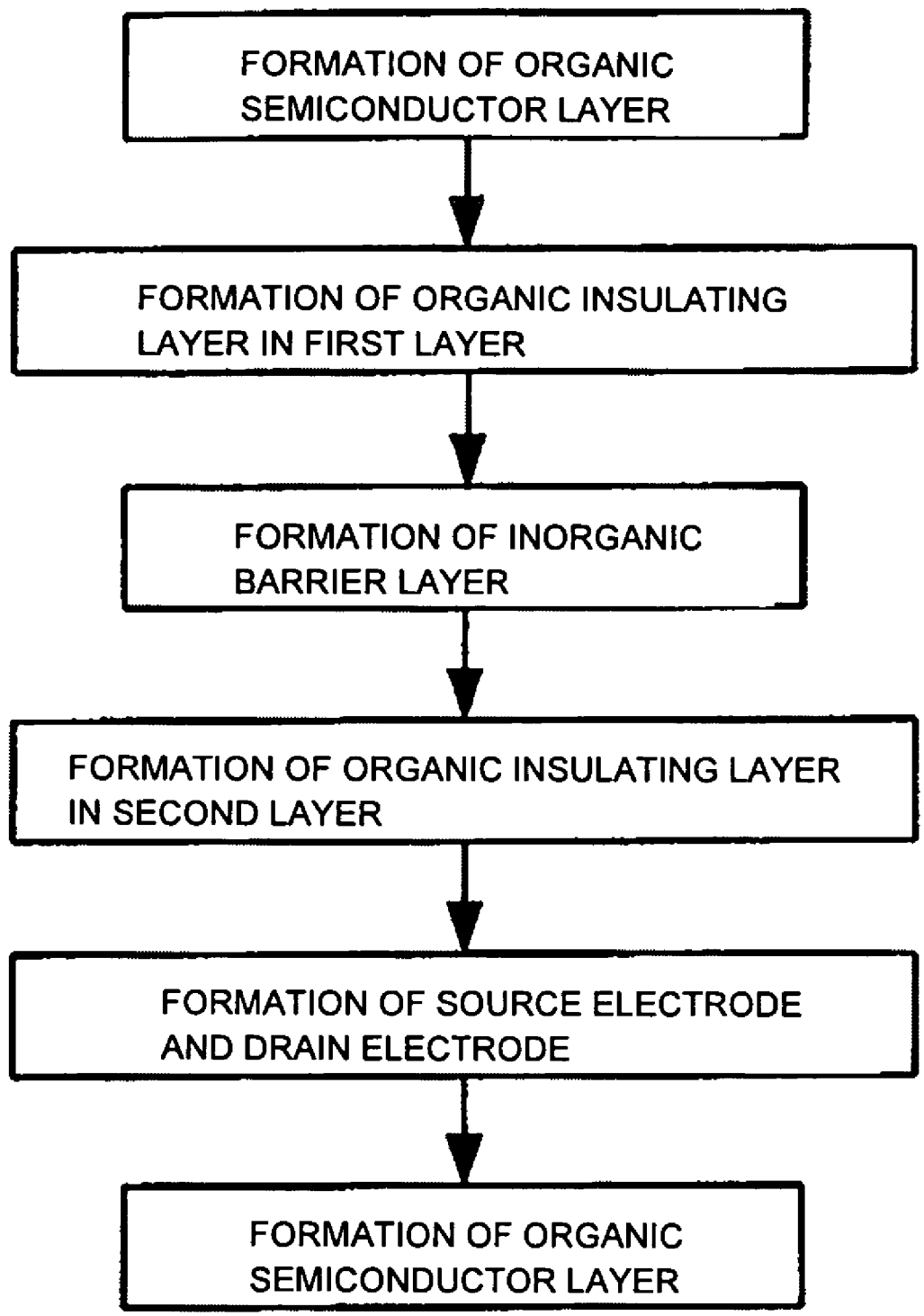
FIG. 6 A flow chart showing a method of manufacturing an organic transistor in Example 2 of the present invention.

In Example 2, the organic transistor show in FIG. 2 was formed. FIG. 6 shows a flow chart illustrating the method of manufacturing the organic transistor in Example 2. In the following, characteristic configurations in Example 2 will be described, and explanation of the configuration identical to that in Example 1 above is omitted.

In Example 2, as the gate insulating layer 3, the organic insulating layer 3a in the first layer and the inorganic barrier layer 3b were formed in order over the gate electrode 2 as in Example 1 described above, and the organic insulating layer 3c in the second layer was formed on the inorganic barrier layer 3b in the same manner as in the first layer. The organic insulating layer 3a in the first layer, the inorganic barrier layer 3b, and the organic insulating layer 3c in the second layer had thicknesses of 150 nm, 100 nm, and 120 nm, respectively.

The organic semiconductor layer 6 was formed by applying a 1 wt % solution of chloroform of poly-3-hexylthiophene onto the source electrode 4 and the drain electrode 5 by spin coating at 1000 rpm.

Example 3

Figure 7:
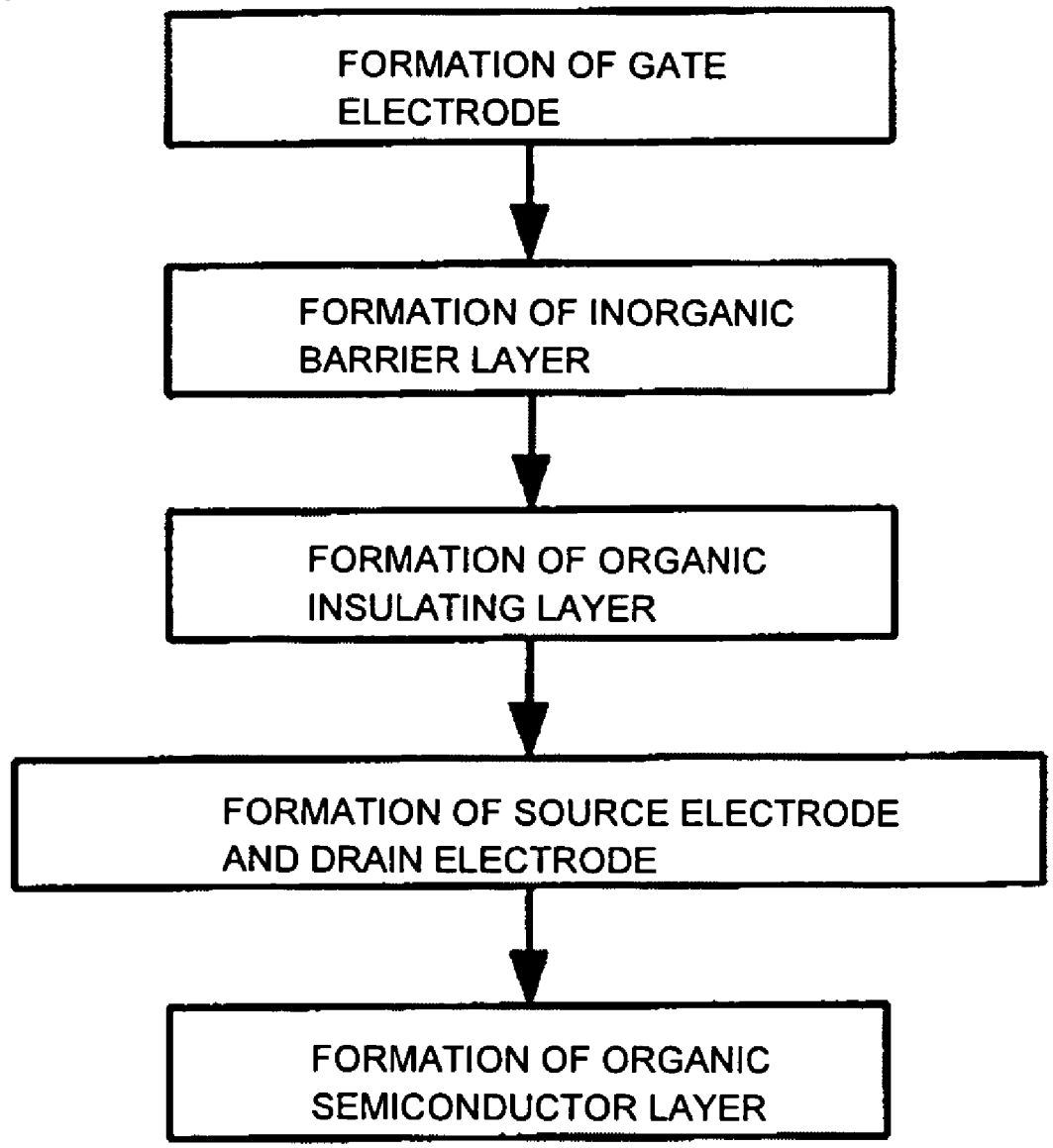
FIG. 7 A flow chart showing a method of manufacturing an organic transistor in Example 3 of the present invention.

In Example 3, the organic transistor show in FIG. 3 was formed. FIG. 7 shows a flow chart illustrating the method of manufacturing the organic transistor in Example 3. In the following, characteristic configurations in Example 2 will be described, and explanation of the configuration identical to those in Examples 1 and 2 above is omitted.

In Example 3, as the gate insulating layer 3, the inorganic barrier layer 3b was formed on the gate electrode 2 in the same manner as in Example 1 described above, and the organic insulating layer 3a was formed on the inorganic barrier layer 3b in the same manner as in Example 1 described above. The inorganic barrier layer 3b and the organic insulating layer 3a had thicknesses of 100 nm and 270 nm, respectively. The organic semiconductor layer 6 was formed on the source electrode 4 and the drain electrode 5 in the same manner as in Example 2.

Comparative Example 1

In comparative example 1, although not shown, the gate insulating layer does not include the inorganic barrier layer but consists of the organic insulating layer in Example 1 described above. Since the remaining configuration is the same as that of Example 1, description thereof is omitted. The organic insulating layer had a thickness of 370 nm.

Comparative Example 2

In comparative example 2, although not shown, the gate insulating layer does not include the inorganic barrier layer but consists of the organic insulating layer in Example 2 described above. Since the remaining configuration is the same as that of Example 2, description thereof is omitted. The organic insulating layer had a thickness of nm.

Table 1 shows the results of the evaluation of the gate leak current after process in Examples and Comparative Examples described above.

TABLE 1

| | Gate leak current (A) |
|---|---|
| Example 1 | $5 \times 10^{-12}$ |
| Example 2 | $7 \times 10^{-12}$ |
| Example 3 | $9 \times 10^{-12}$ |
| Comparative Example 1 | $2 \times 10^{-10}$ |
| Comparative Example 2 | $3 \times 10^{-9}$ |

As shown in Table 1, in each of the gate insulating layers including the inorganic barrier layer formed of the inorganic polymeric material in Examples 1 to 3, the gate leak current after process is reduced.

While the present invention has been described with reference to the specific embodiments, it is apparent to those skilled in the art that various modifications can be made without departing from the scope of the present invention. Thus, the technical scope of the present invention is not limited to the embodiment described above but should be defined on the basis of the claims and the equivalent thereof.

The invention claimed is:

1. An organic transistor comprising:
a substrate;
a pair of a source electrode and a drain electrode;
an organic semiconductor layer provided between the source electrode and the drain electrode; and
a gate electrode provided in association with the organic semiconductor layer with a gate insulating layer interposed therebetween,
wherein the gate insulating layer has a stacked structure including, in order from the side thereof closer to the gate electrode, an organic insulating layer in a first layer, an inorganic barrier layer, and an organic insulating layer in a second layer made of a material of a different type from the organic insulating layer in the first layer.

2. The organic transistor according to claim 1, wherein the inorganic barrier layer includes an inorganic material changed by performing heating, UV treatment, or a combination of UV treatment and ozone treatment of an inorganic polymeric material.

3. The organic transistor according to claim 2, wherein the inorganic polymeric material is polymetalloxane or polysilazane.

4. The organic transistor according to claim 1, wherein the inorganic barrier layer includes a metal oxide and/or a metal nitride.

5. The organic transistor according to claim 1, wherein the inorganic barrier layer has an average surface roughness from 0.1 to 50 nm.

6. The organic transistor according to claim 1, wherein the inorganic barrier layer has a thickness from 5 to 700 nm.

7. A method of manufacturing an organic transistor comprising:
a substrate;
a pair of a source electrode and a drain electrode;
an organic semiconductor layer provided between the source electrode and the drain electrode; and
a gate electrode provided in association with the organic semiconductor layer with a gate insulating layer interposed therebetween,
wherein a step of forming the gate insulating layer includes forming a stacked structure by stacking, in order, an organic insulating layer in a first layer, an inorganic barrier layer, and an organic insulating layer in a second layer made of a different material from the organic insulating layer in the first layer.

8. The method of manufacturing an organic transistor according to claim 7, wherein the inorganic barrier layer is formed by applying an inorganic polymeric material onto an underlying layer and changing the inorganic polymeric material into an inorganic material by heating, UV treatment, or a combination of UV treatment and ozone treatment.

9. The method of manufacturing an organic transistor according to claim 8, wherein the inorganic polymeric material is polymetalloxane or polysilazane.

10. The method of manufacturing an organic transistor according to claim 8, wherein the heating is performed at a temperature of 400° C. or lower.

11. The method of manufacturing an organic transistor according to claim 7, wherein the inorganic barrier layer including a metal oxide and/or a metal nitride is formed on an underlying layer by using a vacuum process.

12. The method of manufacturing an organic transistor according to claim 7, wherein the inorganic barrier layer has an average surface roughness from 0.1 to 50 nm.

13. The method of manufacturing an organic transistor according to claim 10, wherein the inorganic barrier layer has a thickness from 5 to 700 nm.

* * * * *